(12) United States Patent
Kang et al.

(10) Patent No.: US 6,407,446 B2
(45) Date of Patent: Jun. 18, 2002

(54) LEADFRAME AND SEMICONDUCTOR CHIP PACKAGE HAVING CUTOUT PORTIONS AND INCREASED LEAD COUNT

(75) Inventors: Je Bong Kang; Jae Won Lee; Heui Seog Kim, all of Asan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/751,710

(22) Filed: Dec. 28, 2000

(30) Foreign Application Priority Data

Dec. 30, 1999 (KR) .............................. 99-65692

(51) Int. Cl.[7] .............................................. H01L 23/48
(52) U.S. Cl. ........................ 257/666; 257/695; 257/696
(58) Field of Search ................................ 257/666, 694, 257/695, 696, 690; 438/123; 361/813

(56) References Cited

U.S. PATENT DOCUMENTS 5,923,092 A * 7/1999 Kang ......................... 257/666
6,153,506 A * 11/2000 Kermani ..................... 438/123

FOREIGN PATENT DOCUMENTS

| JP | 6-21310 | * | 1/1994 |
| JP | 6283626 | | 10/1994 |

* cited by examiner

Primary Examiner—Jhihan B Clark
(74) Attorney, Agent, or Firm—Skjerven Morrill MacPherson LLP; David W. Heid

(57) ABSTRACT

An aspect of the present invention provides a semiconductor chip package that can accommodate many outer leads in a relatively small package outline. The package includes a package body and outer leads along the outline of the package body. The package body outline has concave portions to increase the number of outer leads without increasing the package footprint. For example, the package can have a QFP outline with concave portions on the sides of the QFP outline. The package can have an SOP outline with concave portions on two opposite sides of the SOP outline.

20 Claims, 8 Drawing Sheets

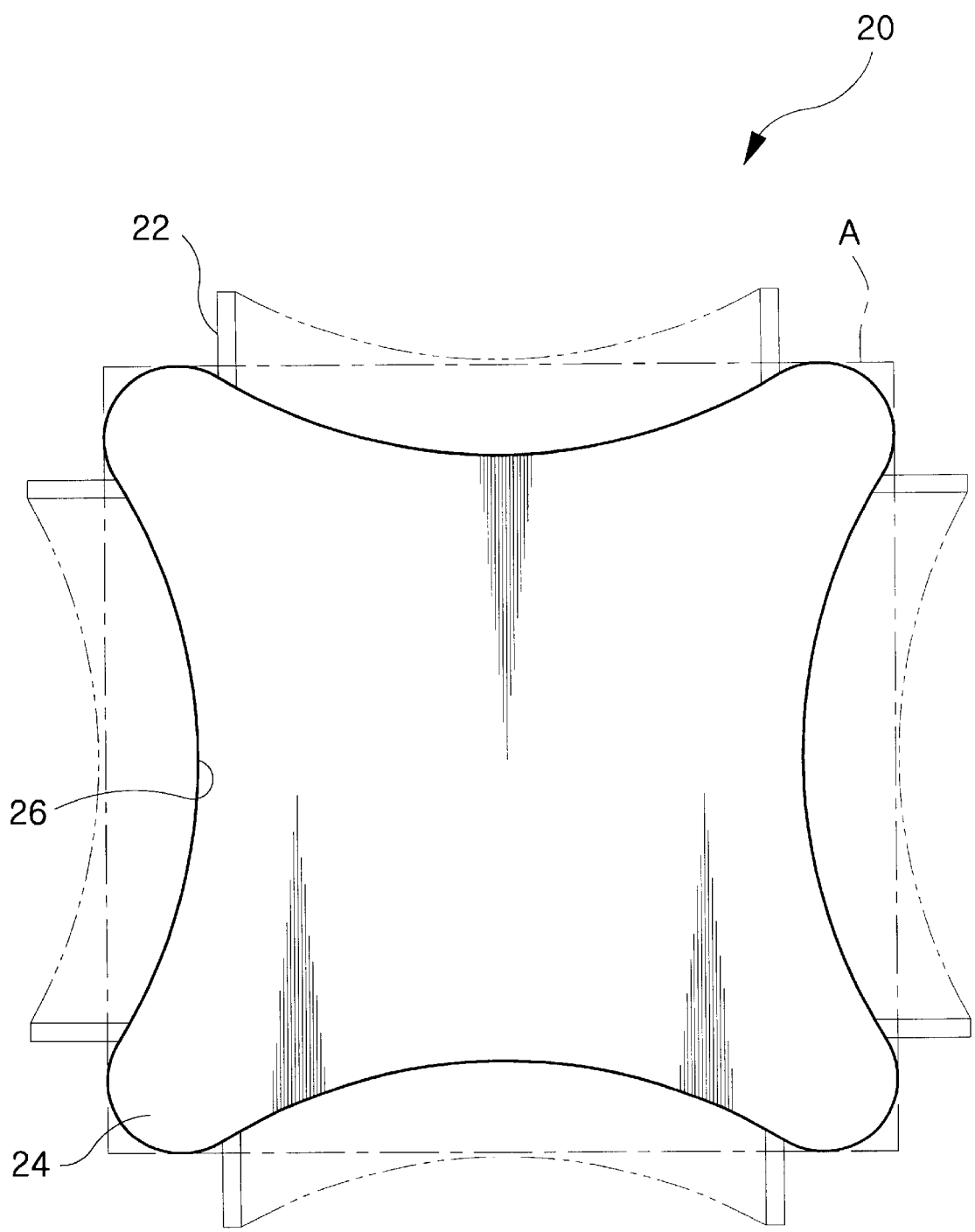

LEADFRAME AND SEMICONDUCTOR CHIP PACKAGE HAVING CUTOUT PORTIONS AND INCREASED LEAD COUNT

BACKGROUND OF THE INVENTION

1. Field of the Invention

The present invention relates to leadframes and semiconductor chip packages, and particularly to a leadframe and a semiconductor chip package having high lead count.

2. Description of the Prior Art

The major trends and goals in the electronic industry have been to achieve high integration, low power consumption, large memory capacity and high processing speed in integrated circuits on a semiconductor chip. High integration and large memory capacity generally require a semiconductor chip having a large number of I/O (Input/Output) pads. Designing compact leadframes and packages for these semiconductor chips is difficult because of the number of leads. While the size of the semiconductor chip package should be minimized, the size and number of I/O pads of a chip such as a random access memory (RAM) chip increases as the memory capacity of the chip increases. The semiconductor chip package thus requires a large mounting area for the chip and a larger perimeter for adequate separation of leads.

FIG. 1 is a top plan view of a semiconductor chip package 10 that is a quad flat package (QFP) with leads 12 having a lead count of 208. The semiconductor chip package 10 has a lead pitch a of 0.5 mm, and each side of the package has a length b of 28.0 mm. The lead pitch a is the distance between center lines of two adjacent leads 12.

The lead count of a semiconductor chip package such as the package 10 can be increased by increasing the external dimensions of the package body or decreasing the lead pitch. I For example, if the length b of the package body is increased to 32 mm and the lead pitch remains 0.5 mm, the lead count of the semiconductor chip package can be increased 240 lead counts. However, increasing the size of a semiconductor chip package is undesirable. Accordingly, decreasing the pitch a of leads 12 may be considered. For example, a semiconductor chip package with a lead count of 256 and an external length of 28 mm requires the lead pitch a of about 0.4 mm. The narrower pitch may result in shorts between adjacent leads. In addition, decreasing the lead pitch a generally requires decreasing the width of leads 12. If the width of leads 12 decreases, the leads 12 are more easily bent during the handling of the semiconductor chip package 10.

Another method for accommodating a large number of external terminals is to employ a different package architecture such as a ball grid array package. Ball grid array packages have a large number of solder bumps, instead of outer leads, as the external terminals. For the same number of external terminals, the solder bump pitch in a ball grid array package can be larger than the outer lead pitch of the package 10. However, the ball grid packages are more expensive than the plastic package such as package 10 of FIG. 1.

FIG. 2 is a top plan view of a semiconductor chip package 20 disclosed in Japanese Patent Laid-Open No. 62-83626, which is incorporated herein by reference in its entirety. FIGS. 2A and 2B illustrate possible variants of the lead configurations in the semiconductor chip package of FIG. 2. In package 20, sides 26 are bow-shaped to increase the perimeter and decrease the area of a package body 24 of package 20, relative to the rectangular area A.

However, contrary to the disclosure in Japanese Patent Laid-Open No. 6-283626, the number of leads 22 cannot be increased without expanding the external dimensions of the package body 24. As shown in FIG. 2A, if the leads 22a extend from the package body parallel to each other, the spacing and the number of leads 22a are the same as those of the conventional example shown in FIG. 1 which has a square planar shape matching the rectangular area A. Accordingly, although the side 26a is longer, the number of leads 22a cannot be increased without reducing lead pitch.

Referring to FIG. 2B, if the leads 22b extend in directions perpendicular to a side 26b, the pitch a' at the ends of the leads 22b, differs from the pitch b' at side 26b. Accordingly, the number of leads 22b cannot be increased without reducing the lead pitch a'. The lead pitch a' should be sufficient to avoid problems such as short circuiting during a soldering process in which attaches the semiconductor chip package 20 to a printed circuit board. Again, although the side 26b is longer, the lead pitch a' decreases when the number of leads 22b increases. Therefore, it is impossible to increase the number of leads 22b without decreasing the lead pitch (a').

SUMMARY OF THE INVENTION

An aspect of the present invention provides a semiconductor chip package that can accommodate many outer leads in a relatively small package. The package includes a package body and outer leads along the perimeter of the package body. The package body has cutout or concave portions to increase the perimeter of the body and the number of outer leads without increasing the package footprint. For example, the package can have a QFP outline with cutout portions on the sides of the QFP outline. The package can have an SOP outline with concave portions on two opposite sides of the SOP outline.

BRIEF DESCRIPTION OF THE DRAWINGS

FIG. 2 is a top plan view of another known semiconductor chip package.

Use of the same reference symbols in different figures indicates similar or identical items.

DETAILED DESCRIPTION OF THE PRESENT INVENTION

An aspect of the present invention provides a semiconductor chip package that can accommodate a large number of outer leads without increasing the size or footprint of the package. A portion of a side of the package is recessed such that extra outer leads can be formed along the recessed portion of the package side. Another aspect of the present invention is directed to leadframes that can be used in the semiconductor chip package.

Figure 1:
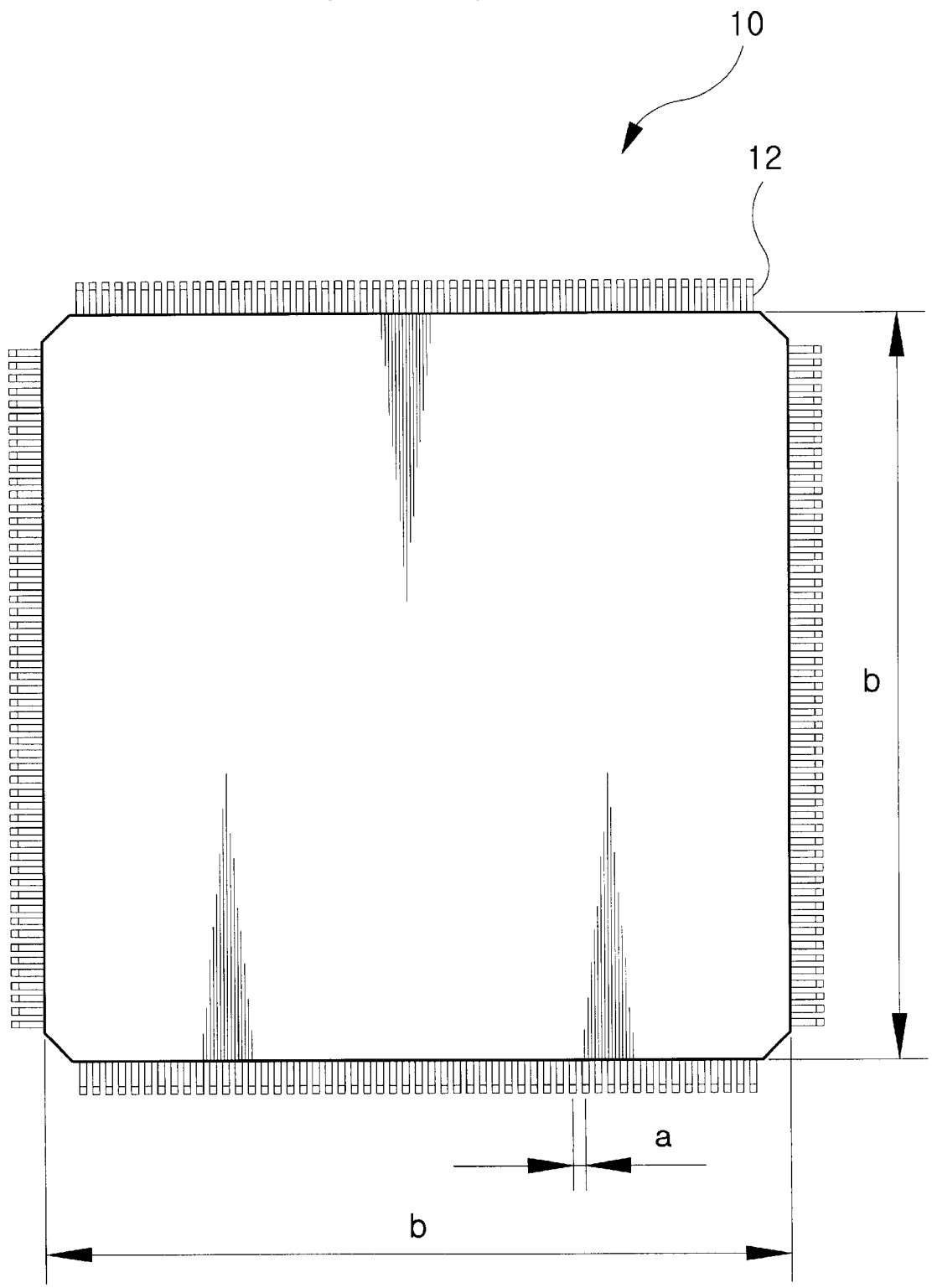
FIG. 1 is a top plan view of a known quad flat package (QFP).
Figure 2A:
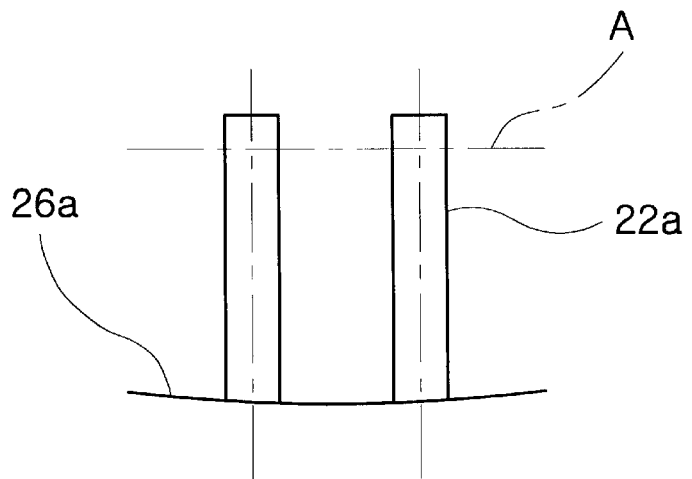
FIGS. 2a and 2b respectively illustrate arrangements of outer leads of the semiconductor chip package of FIG. 2.
Figure 2B:
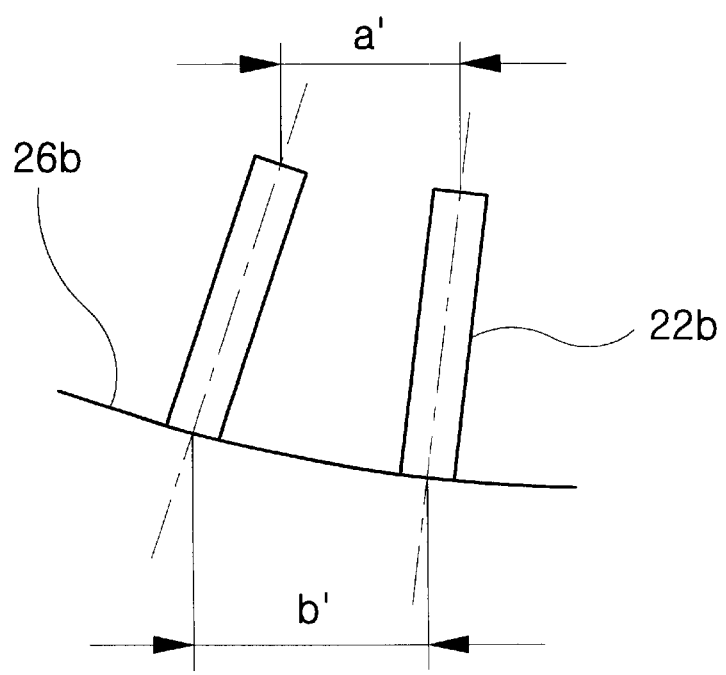
Figure 3:
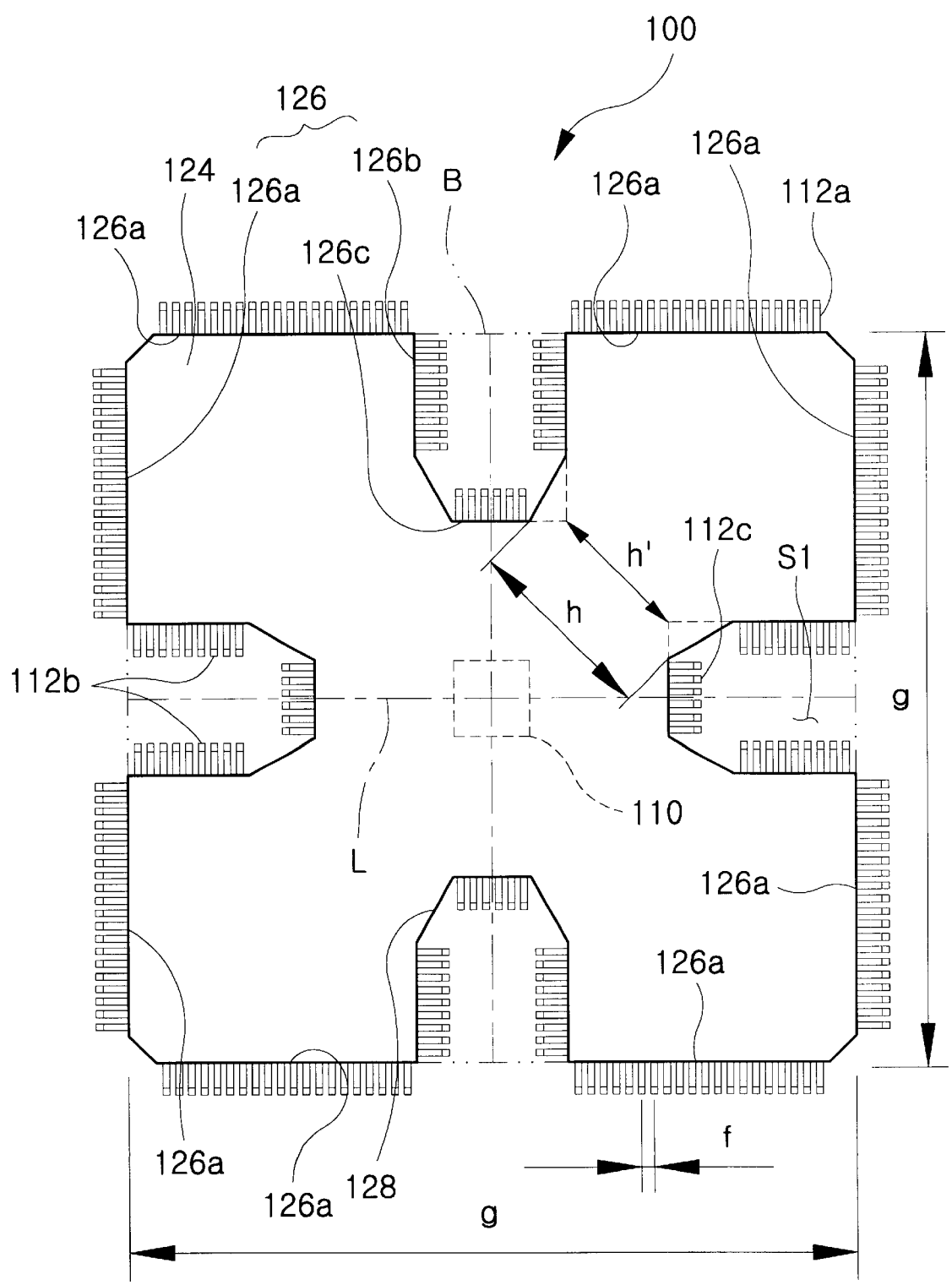
FIG. 3 is a top plan view of a semiconductor chip package according to an embodiment of the present invention.
Figure 4:
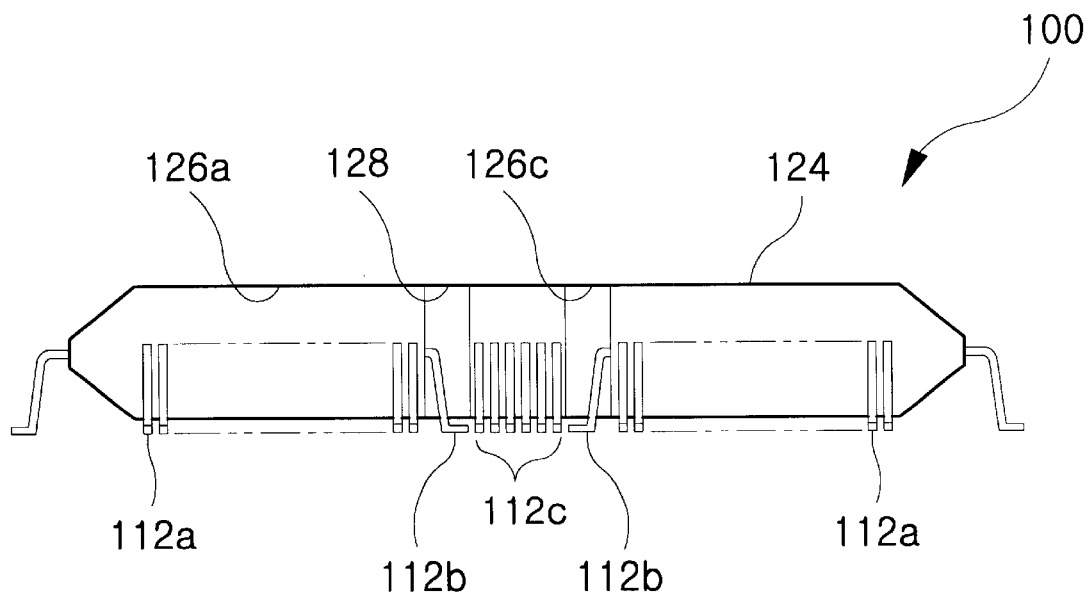
FIG. 4 is a side view of the semiconductor chip package of FIG. 3.

FIGS. 3 and 4 show a plan and side views of a semiconductor chip package 100 according to an embodiment of the present invention. Semiconductor chip package 100 includes a semiconductor chip 110, a package body 124, and outer leads 112a, 112b, and 112c. Semiconductor chip package 100 has 256 outer leads 112a, 112b, and 112c, the lead pitch f is 0.5 mm, and an edge length g is 28.0 mm. Edge length g and lead pitch f of semiconductor chip package 100 are identical to those of semiconductor chip package 10 of FIG. 1, but package 100 has forty-eight more outer leads than does package 10 of FIG. 1.

Semiconductor chip 110 has bonding pads (not shown) formed thereon. The bonding pads, through metal wires (not shown), connect to corresponding inner leads (not shown), which are extensions of outer leads 112a, 112b, and 112c toward chip 110. Package body 124 encapsulates and protects semiconductor chip 110, the inner leads, and the metal wires. Each of sides 126 of package body 124 has a concave portion S1, and is composed of a side 126a, which is a part of a quad flat package outline B, a side 126b, which is a side portion of the concave portion, and a side 126c, which is an inner portion of concave portion S1. Outer leads 112a, 126b, and 126c are on sides 126a, 126b, and 126c, respectively. Concave portions S1 make the perimeter of package 100 longer than that of equivalent quad flat package outline B. Accordingly, package 100 can accommodate more outer leads than the equivalent quad flat package.

Sides 126b are perpendicular to sides 126a, and sides 126c are perpendicular to sides 126b. Sides 128 connect sides 126b and sides 126c. Concave portions $S_1$ are typically formed at the centers of the sides of equivalent QFP outline B.

Outer leads 112a, 112b, 112c extend from package body 124 in a direction perpendicular to sides 126a, 126b, and 126c, respectively. Outer leads 112c are away from outer leads 112b to prevent shorts between adjacent outer lead 112c and outer lead 112b when package 100 is mounted on a printed circuit board. More particularly, sides 128, which extend between outer leads 126b and 126c, provide a space between outer leads 112c and outer leads 112b.

Sides 128 also provide a wider space, which can accommodate the inner leads (reference numeral 222a and 222b of FIG. 6) of outer leads 112a and 112b, by enlarging the distance between concave portions from h' to h. The inner leads extends from near die pad (reference symbol 230 of FIG. 6) to outer leads 112a and 112b through the space defined by h.

Manufacturing of semiconductor chip package 100 may require, in the mold-die cavity for package 100, two or more gates and air-vent slots at each corner of the cavity to prevent voids in package body 124.

Figure 5:
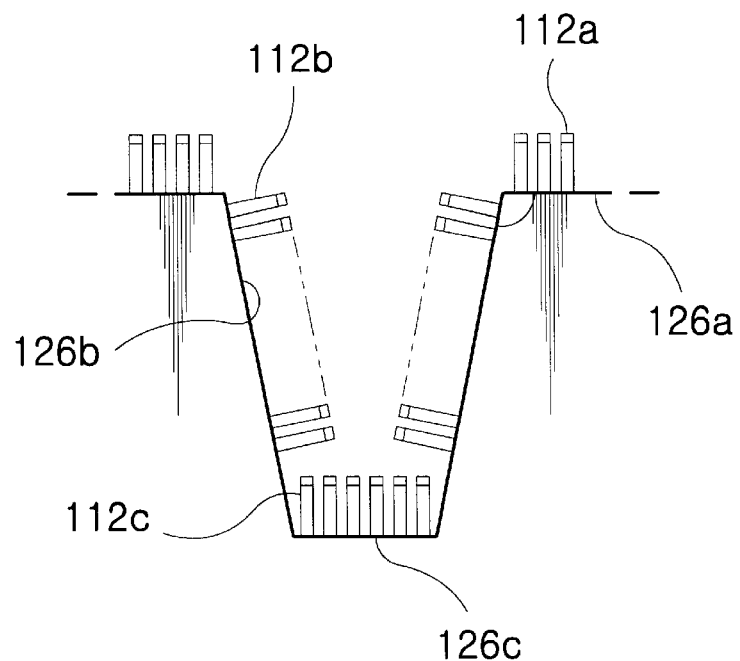
FIG. 5 is a partially enlarged top plan view of a semiconductor chip package according to another embodiment of the present invention.

FIG. 5 illustrates a concave side portion of a semiconductor chip package according to another embodiment of the present invention. The package is identical to package 100 of FIG. 3 except for the shape of the concave portion and the orientations of the outer leads within the concave portion. FIG. 5 shows the concave portion of the package. Sides 126b are not perpendicular to sides 126a, and sides 126c are still parallel to sides 126a. Outer leads 112a, 112b, and 112c are still perpendicular to sides 126a, 126b, and 126c, respectively. Sides 126b and sides 126a form an obtuse angle between them.

Figure 6:
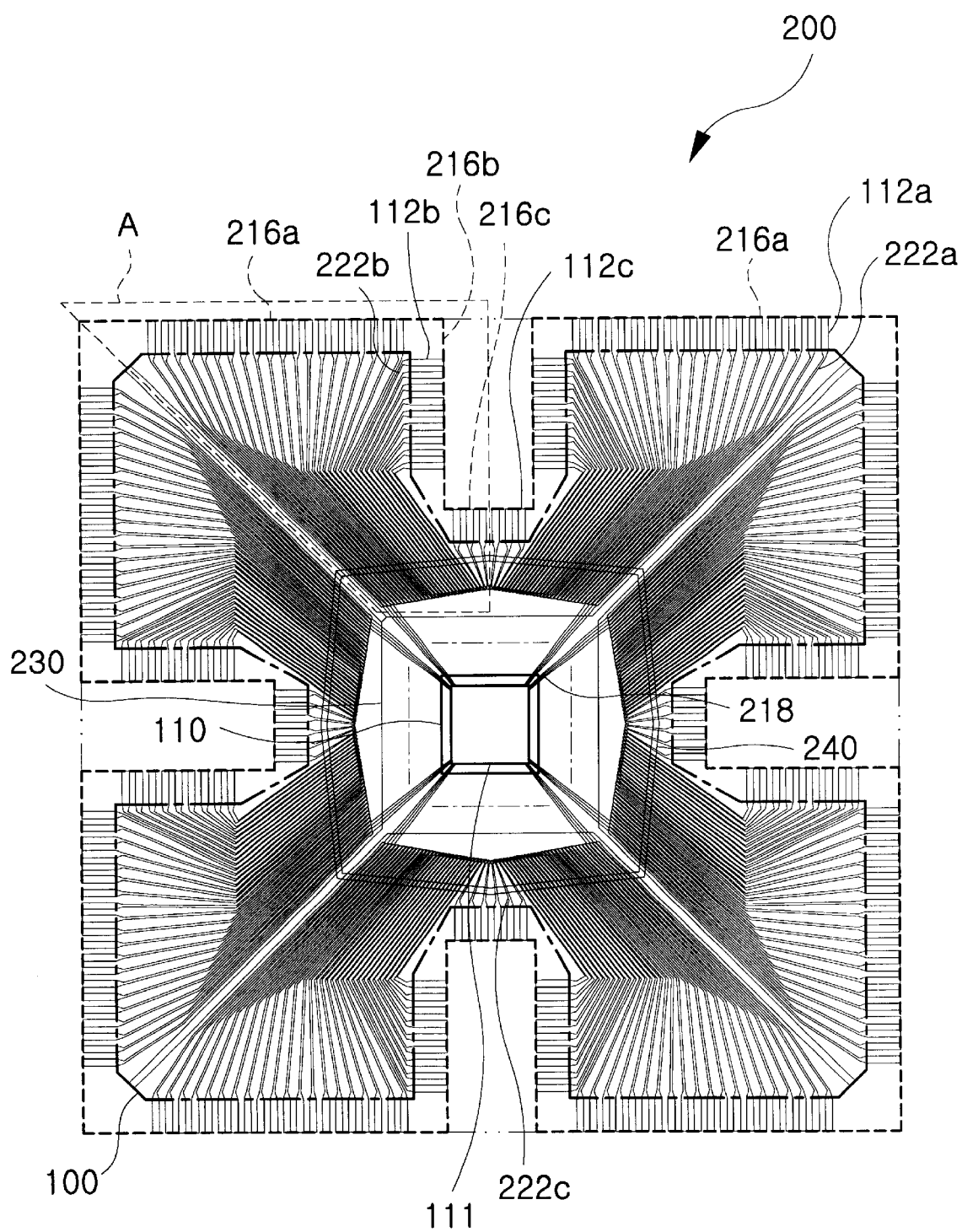
FIG. 6 is a top plan view of a leadframe used in the semiconductor chip package of FIG. 3.
Figure 7:
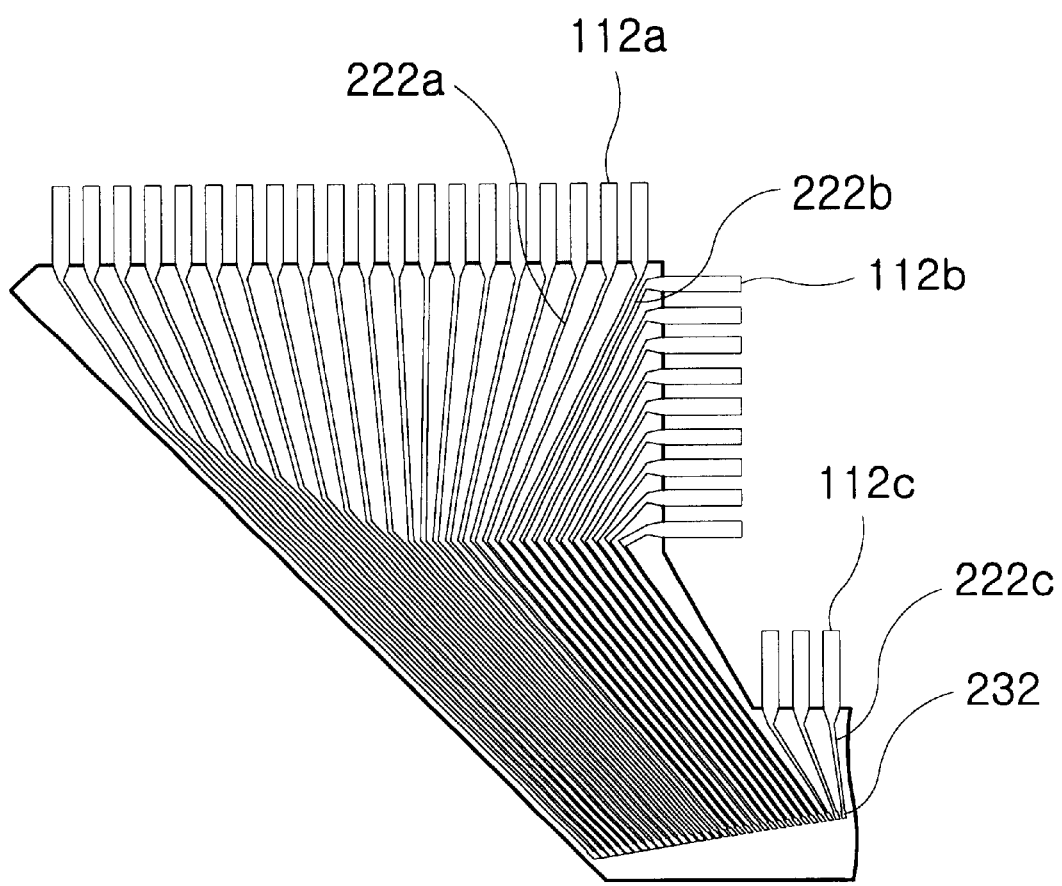
FIG. 7 is a partially enlarged top plan view of the leadframe of FIG. 6.

FIGS. 6 and 7 show a leadframe 200 used in semiconductor chip package 100 of FIG. 3. FIG. 7 is an exploded view of portion A of leadframe 200. Leadframe 200 includes inner leads 222a, 222b, and 222c, which respectively extend from outer leads 212a, 212b, and 212c toward a die pad 230, on which a semiconductor chip 110 is attached. Alternate sequence of dashes and dots indicates the outline of package body 124 of FIG. 3. Metal wires 218 connect the tips of inner leads 222a, 222b, and 222c to corresponding bonding pads 111 of semiconductor chip 110. A tape ring 240 attached to the middle of inner leads 222a, 222b, and 222c, supports inner leads 222a, 222b, and 222c. Tape ring 240 is often made of an insulating film, for example, polyimide film. Dotted line indicates the outline of outer leads 112a, 112b, and 112c. In other embodiments, the inner leads 222a, 222b, and 222c can have a Lead-On-Chip (LOC) or a Tape-Automated-Bonding (TAB) structure.

The package and leadframe described above were modified from a QFP and its leadframe. That is, concave portions were on the four sides of the equivalent QFP. Another embodiment of the present invention also provides a package and a leadframe that are modified from a small outline package (SOP) or a dual in-line package (DIP) and its leadframe. That is, the concave portions are on two opposite sides of the package. In addition, multiple concave portions can be formed along one side of the semiconductor package.

Figure 8:
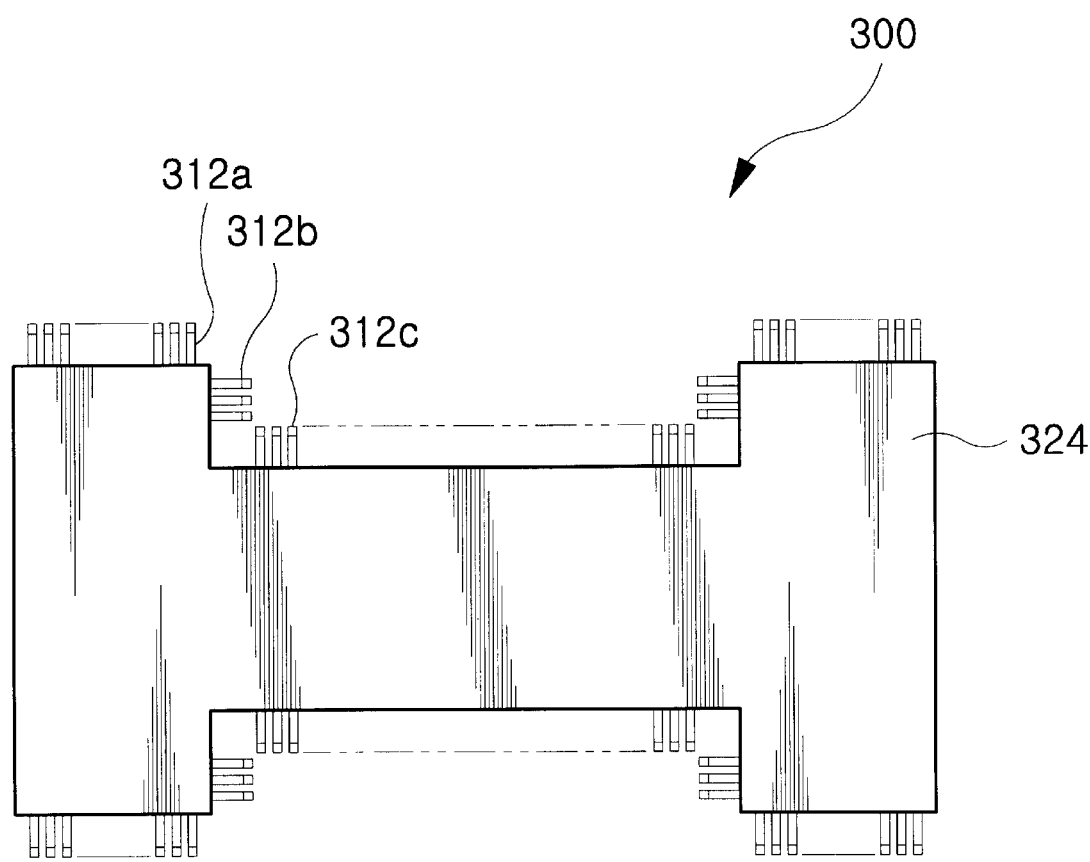
FIG. 8 is a top plan view of a semiconductor chip package according to still another embodiment of the present invention.

FIG. 8 is a top plan view of a semiconductor chip package 300 according to another embodiment of the present invention. Semiconductor chip package 300 has a small outline package (SOP) outline with two concave portions. Outer leads 312b and 312c are in the concave portions, and outer leads 312a are at the same locations that outer leads of the equivalent SOP are at. Reference symbol 324 denoted body of Semiconductor chip package 300.

Although the invention has been described with reference to particular embodiments, the description is only an example of the invention's application and should not be taken as limiting. Various adaptations and combinations of features of the embodiments disclosed are within the scope of the invention as defined by the following claims.

What is claimed is:

1. A semiconductor chip package comprising:
   a semiconductor chip;
   a plurality of leads electrically connected to the semiconductor chip; and
   a package body enclosing the semiconductor chip and inner portions of the leads;
   wherein the package body comprises an external line which comprises a first and a second external line and the leads comprise a first and a second lead, wherein the first lead protrudes from the package body along the first external line and the second lead protrudes from the package body along said second external line, wherein the first external line and an extended line thereof form an imaginary figure and the second external line extends into the imaginary figure at an angle to the first external line, and wherein a total length of the first and second external line is longer than a length of all sides of the imaginary figure.

2. The semiconductor chip package according to claim 1, wherein the imaginary figure is of a tetragonal shape.

3. The semiconductor chip package according to claim 1, wherein the second external line is perpendicular to the first external line.

4. The semiconductor chip package according to claim 1, wherein the second external line forms a concave portion inside the imaginary figure, wherein the concave portion locates on a center line which intersects opposing sides of the imaginary figure.

5. The semiconductor chip package according to claim 3, further comprising a third external line inside the imaginary figure at an angle to the second external line.

6. The semiconductor chip package according to claim 5, further comprising a third lead, wherein the third lead protrudes from the package body along the third external line.

7. The semiconductor chip package according to claim 5, wherein the second external line is connected to the third external line by a bevel which is inclined relative to the second and third external lines, respectively.

8. The semiconductor chip package according to claim 4, wherein the second external line is provided at each side of the imaginary figure.

9. The semiconductor chip package according to claim 4, wherein the second external line is provided at opposing two sides of the imaginary figure.

10. A leadframe comprising a plurality of leads, each of the leads comprising an inner lead and an outer lead integral with the inner lead, wherein the leads comprising a plurality of first leads and a plurality of second leads, each of the first leads comprising a first inner lead and a first outer lead and each of the second leads comprising a second inner lead and a second outer lead, wherein respective tips of the first outer leads are arranged on a first imaginary line and respective tips of the second outer leads are arranged on a second imaginary line, wherein said first imaginary line and an extended line thereof form an imaginary figure and the second imaginary line extends into the imaginary figure at an angle to the first imaginary line, and wherein a total length of the first and second imaginary line is longer than a length of all sides of the imaginary figure.

11. The leadframe according to claim 10, wherein the imaginary figure is of a tetragonal shape.

12. The leadframe according to claim 11, wherein the second imaginary line is perpendicular to the first imaginary line.

13. The leadframe according to claim 11, further comprising a plurality of third leads, each of the third leads comprising a third inner lead and a third outer lead integral with the third inner lead, wherein respective tips of the third outer leads are arranged on a third imaginary line, wherein the third imaginary line is inclined at an angle to the second imaginary line within the imaginary figure.

14. The leadframe according to claim 11, wherein the second imaginary line forms a concave portion inside the imaginary figure, wherein the concave portion locates on a center line which intersects opposing sides of the imaginary figure.

15. The leadframe according to claim 11, further comprising a die pad for mounting a semiconductor chip at a central portion of the leadframe.

16. The lead frame according to claim 14, wherein the second imaginary line is provided at each side of the imaginary figure.

17. The leadframe according to claim 14, wherein the second imaginary line is provided at opposing two sides of the imaginary figure.

18. A semiconductor chip package comprising:
a package body, wherein an outline of the package body comprises a plurality of sides, and at least one of the sides comprises at least one concave portion, an outline of concave portion comprising a plurality of sides; and
a plurality of outer leads along the outline.

19. The semiconductor chip package according to claim 18, wherein the outline of the package body has four sides, and each of the four sides has the concave portion.

20. The semiconductor chip package according to claim 18, wherein the outline of the package body has two opposite sides, and each of the opposite sides has the concave portion.

* * * * *